(12) United States Patent
Sung et al.

(10) Patent No.: US 6,331,721 B1
(45) Date of Patent: Dec. 18, 2001

(54) MEMORY CELL WITH BUILT IN ERASURE FEATURE

(76) Inventors: Kuo-Tung Sung, 1F, #34, Lane 376, Section 1, Kuang-Fu Road, Hsin-Chu; Wen-Ting Chu, #668, Chung-Cheng Road, Allen, Kaosiung County; Huoy-Jong Wu, No. 39 Lane 107, Sung-Chu Road, Taichung, all of (TW)

( * ) Notice: Subject to any disclaimer, the term of this patent is extended or adjusted under 35 U.S.C. 154(b) by 0 days.

(21) Appl. No.: 09/264,210

(22) Filed: Mar. 5, 1999

Related U.S. Application Data

(62) Division of application No. 08/916,758, filed on Aug. 19, 1997, now Pat. No. 5,963,806.

(30) Foreign Application Priority Data

Dec. 9, 1996 (TW) .............................................. 85115219 A

(51) Int. Cl.$^7$ ................................................ H01L 29/788
(52) U.S. Cl. .......................................... 257/317; 257/321
(58) Field of Search ..................... 257/317, 321; 438/266

(56) References Cited

U.S. PATENT DOCUMENTS

| | | | |
|---|---|---|---|
| 4,495,693 | 1/1985 | Iwahashi et al. | 438/258 |
| 4,670,090 | 6/1987 | Sheng et al. | 438/571 |
| 4,795,718 | 1/1989 | Beitman | 438/305 |
| 4,988,635 | 1/1991 | Ajika et al. | 438/258 |
| 5,225,360 | 7/1993 | Shim et al. | 438/182 |
| 5,267,194 | * 11/1993 | Jang | 257/327 |
| 5,272,100 | 12/1993 | Satoh et al. | 438/305 |
| 5,352,618 | 10/1994 | Larsen et al. | 438/264 |
| 5,445,983 | 8/1995 | Hong | 438/258 |
| 5,550,065 | 8/1996 | Hashemi et al. | 438/182 |
| 5,674,768 | 10/1997 | Chang et al. | 438/264 |
| 5,756,384 | 5/1998 | Tseng | 438/257 |
| 5,773,333 | 6/1998 | Jo | 438/182 |
| 5,780,892 | * 7/1998 | Chen | 257/317 |
| 5,963,806 | * 10/1999 | Sung et al. | 438/182 |

* cited by examiner

Primary Examiner—Mark V. Prenty

(57) ABSTRACT

An E$^2$PROM or a flash memory cell having a sharp tip or thin wedge at one of its gates, e.g., the floating gate, for the erasure of electrical charges stored in the floating gate. A recess is formed between a first polysilicon gate and the substrate by removing portions of an insulating layer interposed between the first gate and the substrate. Another insulating layer, e.g., thermal oxide, is formed on the exposed portions of the first gate and the substrate, and partially fills the recess. A second polysilicon layer is formed on the thermal oxide and patterned to form a floating gate. The partially filled recess causes a sharp polysilicon tip or thin wedge to be formed as part of the floating gate. This sharp tip or thin wedge can generate a high electrical field that facilitates the removal of the stored electrical charges from the floating gate.

16 Claims, 3 Drawing Sheets

MEMORY CELL WITH BUILT IN ERASURE FEATURE

This application is a division of U.S. patent Ser. No. 08/916,758, filed Aug. 19, 1997 and now U.S. Pat. No. 5,963,806.

FIELD OF THE INVENTION

This invention relates to the fabrication of $E^2$PROMs and flash memory cells in general, and more particularly to the fabrication of $E^2$PROM or flash memory cells hang built-in silicon tips or wedges for the erasure of electric charges in the floating gate of the memory cells.

BACKGROUND OF THE INVENTION

Read-only memory (ROM) is a semiconductor memory device containing fixed data patterns determined at fabrication. Because changing a single bit in the stored data would require alteration of the entire circuit and its fabrication, ROMs are often made using a process called mask programming, by which data is typically stored in the ROM at one of the final process steps. The economic advantage of a mask ROM is obvious: all ROMs may be fabricated similarly, and customization takes place only during one of the process steps.

In contrast to conventional ROMs or mask ROMs in which the data must be stored in the device during fabrication, a programmable read-only memory (PROM) allows the user to electrically program the data into the memory. However, a conventional PROM cell can be programmed only once. For example, a typical arrangement employed in a bipolar-junction transistor (BJT) PROM involves the use of polysilicon filses to connect the emitter to the corresponding digit line. Depending on the desired content of the memory cell, the fuses are either left intact or blown open by a large current during programming. Obviously, such a programming step is irreversible.

To improve the conventional non-erasable PROM, several erasable semiconductor memory cells have been developed, including the erasable read-only memory (EPROM), the electrically alterable read-only memory (EAROM), the electrically erasable read-only memory (EEPROM or $E^2$PROM), $E^2$PROM-EAROM, and the nonvolatile static random-access memory (SRAM). Each of these erasable semiconductor memory cells may be used in a variety of applications. For example, low-density EAROMs (less than 8k) can be used in consumer radio tuners and automotive engine controllers.

A typical way to achieve nonvolatile data storage in the above erasable or alterable programmable memory cells is to use a floating gate, typically located between a control gate and a substrate and capable of holding electrical charges for an indefinite period of time. The control gate and the floating gate are typically made of the same material, e.g., polysilicon, while the substrate generally has a lightly doped source and drain region. When carrying no charges, the floating gate has no influence on the electrical field generated by the control gate in the channel region between the source and the drain. However, if the floating gate is charged with electrons, these electric charges in the floating gate will generate in the channel region an electrical field opposite to the field generated by an active control gate. Thus, if an active signal at the control gate cannot generate a sufficiently strong field to turn on the memory transistor, the transistor will store the value "0." Only with a much higher control gate potential can the memory transistor be turned on and store the value "1". In other words, the field of the control gate must be strong enough to compensate the field of the floating gate and to make the channel between the source and the drain conductive.

To reprogram a conventional EPROM, the electrons in the floating gates are erased by exposure to an ultraviolet (UV) irradiation. Electrons in the floating gates are energized by the UV light and are thus able to leave the floating gates. Nonetheless, to enable the memory chip to be exposed to UV radiation, the package of an EPROM (usually made of ceramics) must have a window made of a material transparent to UV, e.g., quartz glass. In addition, the electric charges in a whole EPROM array are erased all at once, dictating a time-consuming reprogramming process at all the array cells.

Some of the above limitations of the EPROM may be overcome by the use of an $E^2$PROM, in which the electric charges in a floating gate can be electrically erased. A cross-sectional view of a typical prior-art stacked-gate $E^2$PROM device having two layers of polysilicon is shown in FIG. 1. The substrate 10 is a single-crystal silicon substrate. An active region is defined by an insulating field oxide (FOX) region 12. A first silicon dioxide layer is formed on the substrate 10 as the tunnel oxide layer 14. A first polysilicon layer deposited and lithographically patterned on the tunnel oxide layer 14 to form a floating gate 16. A second silicon dioxide layer is deposited on the floating gate 16 to form an insulating layer 18. Both oxide layers are typically approximately 50 nm thick. A second polysilicon layer is then deposited by a chemical vapor deposition (CVD) process and lithographically patterned on the insulating layer 18 to form a control gate 20. Finally, source 22 and drain 24 regions are formed in the substrate by ion implantation. An n-doped drain 24 and a p-doped substrate 10 thus form a p-n junction in the substrate 10.

An $E^2$PROM may be programmed in the same way as an EPROM, e.g., through hot electron injection generated by a voltage pulse between the control gate 20 and the drain 24. In this process, electrons generated in the drain 24 traverse the tunnel oxide layer 14 and accumulate in the floating gate 16. Alternatively, the floating gate 16 may be charged by an avalanche injection mechanism, by which electrical potentials are applied to cause high-energy electrons in the channel region between the source 22 and the drain 24 to be injected across the insulating tunnel oxide layer 14 into the floating gate 16.

To erase the $E^2$PROM, an inverse voltage is typically applied between the control gate 20 and the drain 24. As a result, the electrons in the floating gate 16 travel across the tunnel oxide 14 layer into the drain 24; the stored data is thus erased. It is important that this discharge process does not last too long, otherwise too many electrons will tunnel out of the floating gate 16, making it positively charged. Conventional $E^2$PROMs have several advantages including byte erase, byte program and random access read capabilities. However, such memory cells generally call for two transistors per bit: a memory transistor and a select transistor, resulting in a relatively large cell size.

Another erasable, nonvolatile memory cell is the flash memory cell, in which the contents of all memory array cells can be erased simultaneously through the use of an electrical erase signal. Flash memories are based on either the EPROM or $E^2$PROM technology; the selection between the two requires tradeoffs between the higher density of the EPROM technology and the in-circuit programming flexibility of the $E^2$PROM technology. The structure of a flash memory cell is essentially the same as that of an EPROM or E$^2$PROM cell, except that the tunnel oxide in a flash memory cell is thinner than that of an E$^2$PROM memory cell, thus allowing lower program and erase voltages to be applied between the control gate and the drain. Flash memories have the capability of electrical program, read, and data storage in a memory cell. Although a flash memory does not permit bit-by-bit erasure, it can be electrically programmed and erased in a block-by-block manner.

Although the above prior-art E$^2$PROM or flash memory technology have solved a number of problems associated with prior-art EPROMs, several problems still exist during the erasure of stored information in a prior-art E$^2$PROM or flash memory cell. First, the typical thickness (approximately 10 nm) of the tunnel oxide layer 14 of EEPROM and flash memory cells does not allow the use of a conventional E$^2$PROM power supply to generate an adequate Fowler-Nordheim tunneling current for fast erasure. Second, the use of a higher electrical potential (and hence a higher erasure current) may cause junction breakdown, leading to excessive substrate current during erasure. Third, electrical holes generated by the band-to-band leakage current may be trapped in the tunnel oxide, resulting in the degradation of the tunnel oxide layer.

SUMMARY OF THE INVENTION

It is therefore an object of the present invention to provide a semiconductor E$^2$PROM or flash memory essentially free of junction breakdown.

It is another object of the present invention to provide a semiconductor E$^2$PROM or flash memory cell comprising a structure capable of generating a high electric field for the erasure of electrical charges in the memory cell.

It is a further object of the present invention to provide a semiconductor E$^2$PROM or flash memory comprising a floating gate having a silicon tip or wedge, which generates a high electric field that can be used to erase the electric charges in the floating gate.

In a specific embodiment of the present invention, a semiconductor E$^2$PROM or flash memory cell comprising a floating gate having a silicon tip or wedge is fabricated in accordance with the following steps:

forming active regions separated by field oxide regions on a semiconductor substrate;

forming a first insulating layer on an active region through, e.g., a thermal oxidation process;

sequentially depositing a first polysilicon layer and a second insulating layer on the first insulating layer;

forming a first gate on the first insulating layer by lithographically patterning the first polysilicon layer and the second insulating layer and exposing portions of the first insulating layer;

over-etching the exposed portions of the first insulating layer to expose portions of the substrate and to form a recess underneath the first gate through, e.g., a wet etching process or a dry etching process;

forming a third insulating layer on the exposed surfaces of the substrate and the first gate through, e.g., a thermal oxidation process;

depositing a second polysilicon layer on the second and third insulating layers through, e.g., a CVD process and allowing the second polysilicon layer to fill the recess to form a sharp tip or wedge under the first gate;

forming a second gate by etching the second polysilicon layer through, e.g., a lithographic etching process;

forming a fourth insulating layer on the second gate;

depositing a third polysilicon layer on the fourth insulating layer; and forming a third gate by etching the third polysilicon layer through, e.g., a lithographic etching process.

An advantage of the present invention is that it provides an improved E$^2$PROM or flash memory in which junction breakdown during data erase is essentially avoided.

Another advantage of the present invention is that it provides an improved E$^2$PROM or flash EPROM in which tunnel oxide layer degradation is largely avoided.

These and other objects, features and advantages of the present invention will become apparent to those skilled in the art after reading the following detailed description of the preferred embodiment which is illustrated in the several figures of the attached drawings.

DETAILED DESCRIPTION OF THE PREFERRED EMBODIMENTS

While the present invention may be embodied in many forms, details of the preferred embodiments at various stages of fabrication are schematically shown in FIGS. 2 through 8, with the understanding that the present disclosure is not intended to limit the invention to the embodiment illustrated. The present invention discloses a new E$^2$PROM or flash memory structure and a semiconductor process for fabricating such a structure. The new process allows the formation of a silicon tip or wedge as an integral part of one of the gates, e.g., the floating gate. This silicon tip or wedge is capable of producing a high electric field to remove the electric charges in the floating gate during memory erasure. The new structure of the present invention avoids the problem of junction breakdown, the need for high erasure currents, and the progressive degradation of tunnel oxide layer, all of which may be present in a prior-art E$^2$PROM or flash memory structure.

Figure 1:
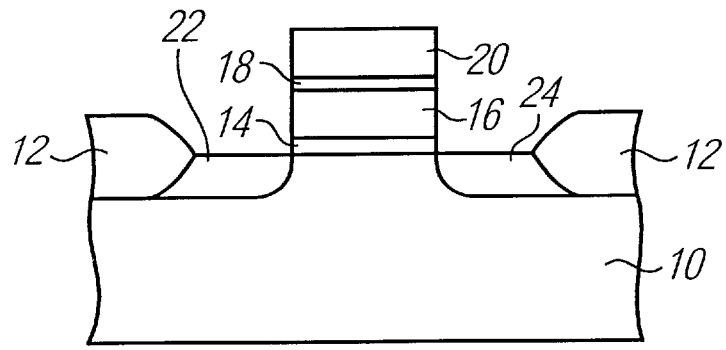
FIG. 1 is a cross-sectional representation of a prior-art E$^2$PROM cell.
Figure 2:
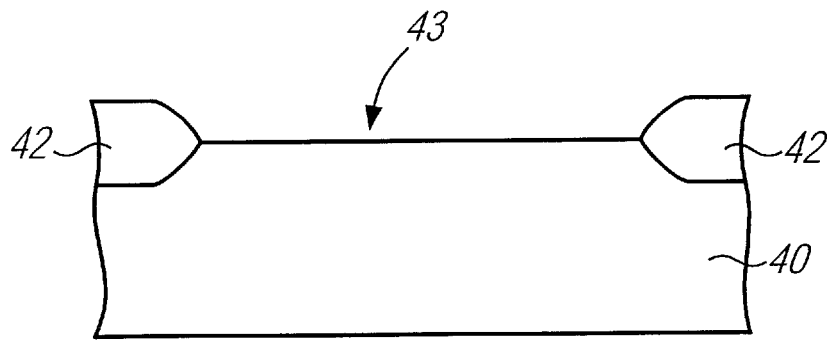
FIG. 2 is a cross-sectional representation of the device of the present invention during fabrication after the step of fonning a field oxide region.

In a specific embodiment of the present invention, an E$^2$PROM or flash memory cell having three polysilicon layers is fabricated by the process described below. As shown in FIG. 2, a cross-sectional view of the device of the present invention at an early stage of fabrication, a single-crystal silicon, e.g., Si<100>, is conveniently chosen as the device substrate 40. Selected portions of the surface of the substrate 40 are oxidized to form field oxide (FOX) regions 42, two of which are shown in FIG. 2. These FOX regions 42 define an active region 43 by electrically isolating the latter region from the surrounding surface regions of the substrate 40. The FOX region 42 may be formed partially or completely inset into substrate 40. Typically, FOX regions 42 are formed by a process comprising the following steps: (i) depositing a mask layer comprising a composite layer of silicon nitride ($Si_3N_4$) and silicon dioxide ($SiO_2$) on the substrate 40; (ii) patterning the composite layer using photolithographic etching; (ii) removing the photoresist layer; and (iii) forming FOX regions 42 by thermally oxidizing the exposed portion of substrate 40 using the patterned composite layer as the etching mask (the FOX regions 42 thus formed are preferably 400 to 600 nm thick); and (iv) removing silicon nitride by hot phosphoric acid and removing silicon dioxide by hydrofluoric acid. Other isolation schemes known in the art, e.g., the shallow trench isolation (STI) process, can also be used to form the FOX region.

Figure 3:
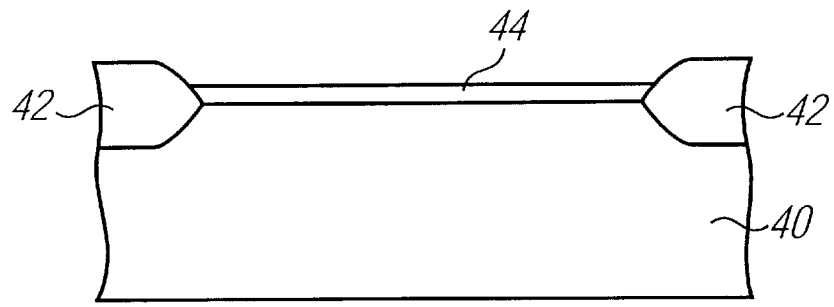
FIG. 3 is a cross-sectional representation of the device of the present invention during fabrication after the step of forming a first insulating (oxide) layer.

Next, as shown in FIG. 3, a first insulating layer 44, preferably having a thickness between approximately 5 and 50 nm, is formed on an active region 43 of the substrate 40. Preferably, the insulating layer 44 is a silicon dioxide formed by a thermal oxidation process in which the substrate 40 is heated in an oxygenated gas environment at approximately 850° to 1000° C. Such a process is well-known in the art.

Figure 4:
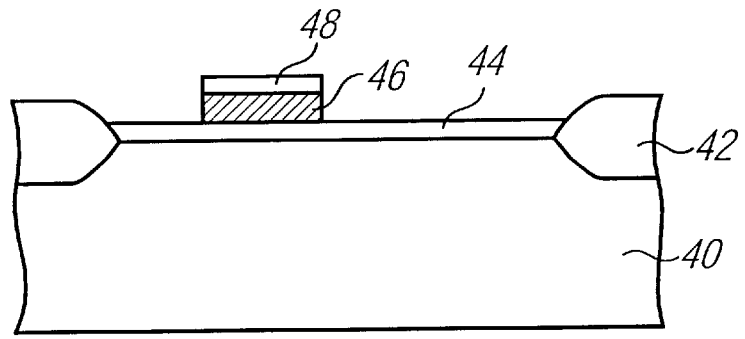
FIG. 4 a cross-sectional representation of the device of the present invention during fabrication after the step of forming a first gate covered by a second insulating layer.

Next, a first silicon layer (not shown) is deposited on the FOX regions 42 and the first insulating layer 44. This first silicon layer is preferably a polycrystalline silicon (or polysilicon) layer deposited by chemical vapor deposition (CVD) or low-pressure chemical vapor deposition (LPCVD), and is preferably between approximately 50 and 500 nm thick. Alternatively, an amorphous silicon layer can be used in lieu of the polysilicon layer. This first silicon layer, once properly patterned using known techniques (see FIG. 4), will form a first gate, e.g., a select gate, of a $E^2PROM$ cell. A second insulating layer (not shown) is subsequently deposited on the first silicon layer. Preferably, this second insulating layer is silicon dioxide formed by chemical vapor deposition (CVD) or thermal oxidation, and is preferably between approximately 5 and 200 nm thick. Alternatively, a CVD silicon nitride layer or a combination of oxide and nitride layers can serve as the second insulating layer. The first silicon layer and the second insulating layer are then lithographically patterned to form a first gate 46 and an insulating layer 48 on top of the first gate 46 as shown in FIG. 4. Typically, a substantial part of the active region 43 is now covered only by the first insulating layer 44 but not by the first silicon layer or the second insulating layer.

Figure 5:
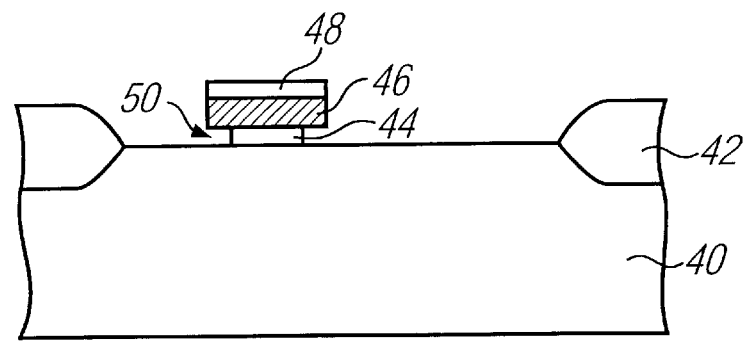
FIG. 5 is a cross-sectional representation of the device of the present invention during fabrication after the step of forming a recess in the first insulating layer underneath the first gate.

Next, an etching process is used to remove the exposed portions of the first insulating layer 44, forming a recess 50 underneath the first gate 46. The insulating layer 48 is protected by a masking layer, e.g., photoresist (not shown) during this etching process. Preferably, recess 50 is formed by either a wet etch process employing, e.g., hydrofluoric acid or buffer oxide etch (BOE) or an isotropic dry etch process using, e.g., $CF_4$ and $O_2$. Such etching processes are well-known in the art. Recess 50 is preferably approximately 2 to 100 nm long measured from the edge of the first gate 46. FIG. 5 shows the device of the present invention during fabrication after recess 50 is formed.

Figure 6:
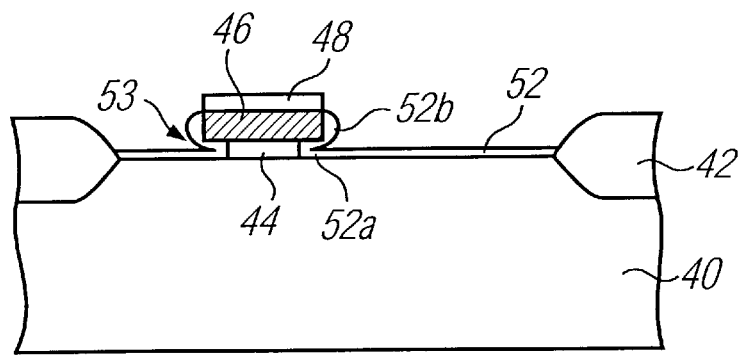
FIG. 6 is a cross-sectional representation of the device of the present invention during fabrication after the step of forming a silicon dioxide layer on the exposed surfaces of the substrate and the first gate.

Next, a third insulating layer 52 is formed on the exposed portions of substrate 40 as well as on the exposed surfaces of the first gate 46. FIG. 6 is a cross-sectional representation of the device of the present invention after the formation of the third insulating layer 52. Preferably, this third insulating layer 52 is a silicon dioxide layer formed by thermal oxidation, e.g., heating the substrate in an oxygenated gas environment at approximately 750 to 950° C. Because of the different oxidation rates, the thickness of thermal oxide 52a grown from substrate 40 may be different from the thickness of thermal oxide 52b grown from the first gate 46. Preferably, the range of thickness of the third insulating layer 52 is between approximately 5 and 50 nm. A cavity 53 is formed between the oxide 52a on substrate 40 and the oxide 52b underneath the first gate 46. The cavity 53 may be extended substantially along the length of the recess 50. Typically, the height of cavity 53 varies according to position and may range approximately between 3 and 50 nm.

Figure 7:
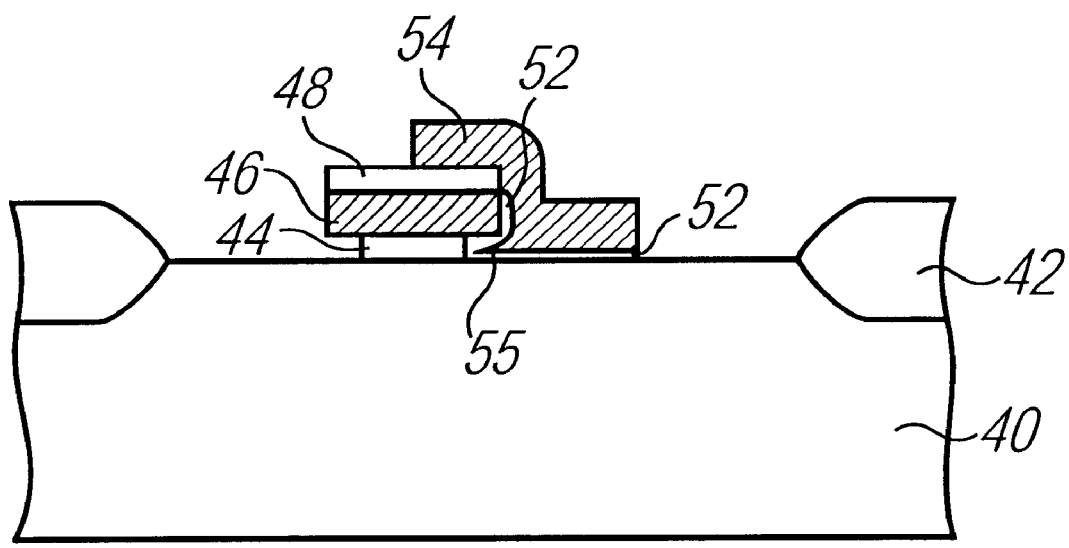
FIG. 7 is a cross-sectional representation of the device of the present invention during fabrication after the step of forming a second gate.
Figure 8:
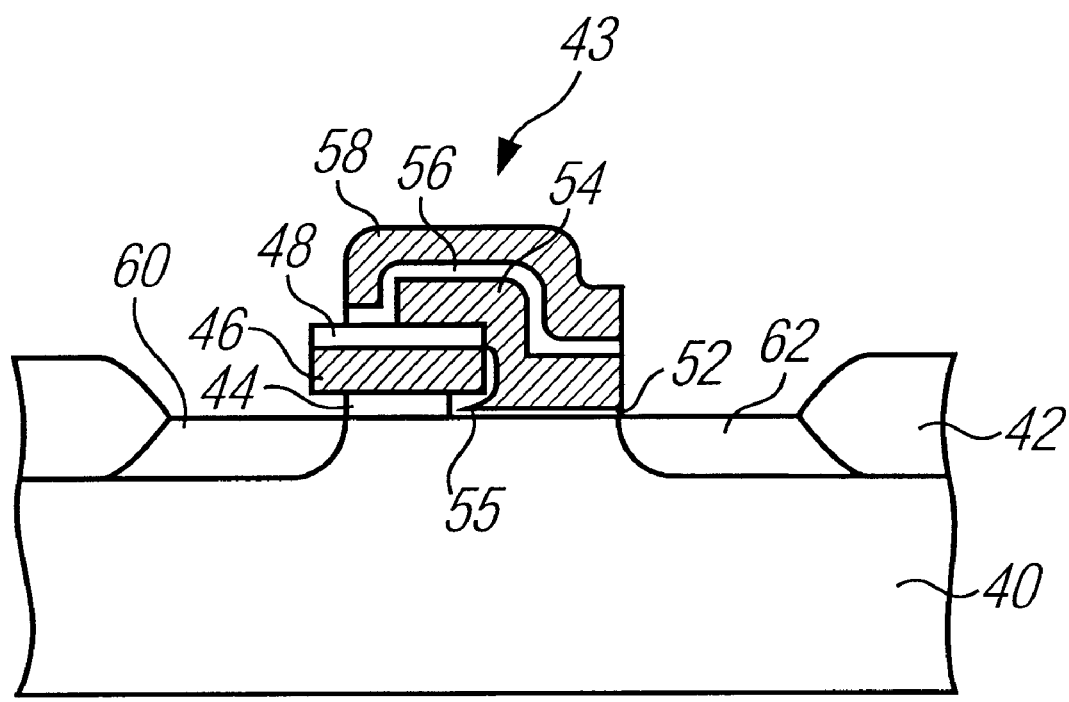
FIG. 8 is a cross-sectional representation of the device of the present invention during fabrication after the step of forming a third insulating layer, a third gate, and doped source and drain regions.

Next, a second silicon layer (not shown) is formed on the second insulating layer 48 and the third insulating layer 52. Preferably, this second silicon layer is a polysilicon layer formed by either CVD or LPCVD and is approximately between 30 and 500 nm thick. Alternatively, the second silicon layer can be an amorphous silicon layer. This second silicon layer, once lithographically patterned using known techniques, forms a second gate, e.g., a floating gate 54 as shown in FIG. 7. The second silicon deposition process also forms a sharp tip or thin wedge 55 (as viewed in three dimensions) filling the cavity 53. This thin wedge or sharp tip 55 is an integral part of the second gate 54 and is capable of generating a high electric field that can be used to erase the electrical charges in the second gate 54.

Finally, a fourth insulating layer 56 is formed on the second gate 54 and typically on a portion of the second insulating layer 48. This fourth insulating layer 56 is typically a silicon dioxide or nitride layer (or a combination of the two) approximately 10 to 100 nm thick. A third silicon layer 58 is subsequently formed and lithographically patterned using known techniques on the fourth insulating layer 56 to become a third gate, e.g., a control gate 58. Preferably, this third silicon layer 58 is a polysilicon layer deposited by a CVD or LPCVD process and is approximately 50 to 500 nm thick. An amorphous silicon layer can be used in lieu of the polysilicon layer. Suitable dopant ions (e.g., P or As) are then implanted in the exposed portions of the active region 43 to form a doped source 60 and a doped drain 62, completing the fabrication of the $E^2PROM$ device.

In the aforesaid embodiment of the present invention, the first, second and third gates are, respectively, a select gate, a floating gate and a control gate. Other combinations are possible in accordance with specific designs of the memory cells. For example, the first gate may be a floating gate, the second gate may be an erase gate, and the third gate may be a control gate. The present invention is not limited to floating-gate tunnel-oxide $E^2PROMs$, nor is it limited to the generation of one silicon tip or wedge per cell. For example, the present invention can be readily adapted to textured-polysilicon $E^2PROMs$ in which a memory cell includes three layers of polysilicon that partially overlap; i.e., poly 1, poly 2 (the floating gate) and poly 3. Thus, either poly 2 or poly 3 or both may have a silicon tip or wedge that facilitates the erasure of electrical charges stored in the floating gate.

The present method of fabrication may be used in the fabrication of a flash memory or $E^2PROM$ cell having two polysilicon (or amorphous silicon) layers. This two-silicon-layer fabrication process is essentially similar to the three-silicon-layer process described above in FIGS. 2–8. Typically, in a two-silicon-layer flash memory or $E^2PROM$ cell, the first silicon layer will form a first gate, e.g., a floating gate, while the second silicon layer will form a second gate, e.g., a control or select gate. According to the present invention, the second gate can be made to have a silicon tip or wedge for the purposes of erasure. Finally, doped source and drain regions can be formed by ion implantation.

While the invention has been particularly shown and described with reference to the above preferred embodiment, it will be understood by those skilled in the art that many other modifications and variations may be made thereto without departing from the broader spirit and scope of the invention as set forth in the claims. Use of the disclosed method is not limited to $E^2PROMs$, but may also be used in fabricating other types of memory devices, e.g., a flash memory. The specification and drawings are accordingly to be regarded as being illustrative, rather than being restrictive.

What is claimed is:

1. A semiconductor memory device fabricated in accordance with a process comprising the steps of:
   forming a plurality of insulation regions on a semiconductor substrate to define at least one active region on the substrate;
   forming a first insulating layer at said active region;
   forming a patterned first silicon layer on a portion of said first insulating layer;
   forming a patterned second insulating layer overlying at least a portion of said first silicon layer;
   forming a recess in said first insulating layer underneath said first silicon layer by removing portions of said first insulating layer between said first silicon layer and said substrate, said recess exposing portions of said substrate and said first silicon layer;
   forming a patterned third insulating layer on said exposed portions of said substrate and said first silicon layer, said third insulating layer partially filling said recess;
   forming a patterned second silicon layer covering at least a portion of said third insulating layer and further filling said recess;
   forming a patterned fourth insulating layer on at least a portion of said second silicon layer; and
   forming a patterned third silicon layer on at least a portion of said fourth insulating layer.

2. The semiconductor memory device of claim 1, wherein said first insulating layer is silicon dioxide.

3. The semiconductor memory device of claim 1, wherein said second insulating layer is silicon dioxide.

4. The semiconductor memory device of claim 1, wherein said recess is formed by isotropic etching.

5. The semiconductor memory device of claim 1, wherein said second silicon layer includes at least one of a sharp tip and a thin wedge filling said recess.

6. A semiconductor memory device fabricated on a semiconductor substrate comprising a plurality of insulation regions, said insulation regions defining at least one active region, said active region including:
   a plurality of gates made of polycrystalline silicon and capable of conducting and storing electrical charges;
   a plurality of insulating layers made of silicon dioxide and interposed between said substrate and said gates and between adjacent said gates, one of said gates being a control gate having at least one of a sharp tip and a thin wedge, said sharp tip or thin wedge extending under another said gate and capable of generating a high electrical field for the erasure of electrical charges in said gates.

7. The semiconductor memory device of claim 6, wherein
   said insulation regions are formed spaced apart on said substrate and
   said another gate includes a first of said insulating layers formed on said active region and a patterned first silicon layer formed on a portion of said first insulating layer, and further includes a second of said insulating layers formed on at least a portion of said first silicon layer, said first insulating layer being adapted to define a recess under said first silicon layer by substantially removing portions of said first insulating layer between said first silicon layer and said substrate, said recess providing exposed portions of said substrate and said first silicon layer.

8. The semiconductor memory device of claim 7, wherein said one gate further comprises:
   a third of said insulating layers formed on said exposed portions and partially filling said recess, and
   a patterned second silicon layer formed on at least a portion of said third insulating layer and further filling said recess, said second silicon layer being adapted to form said sharp tip and said thin wedge.

9. The semiconductor memory device of claim 8, further comprising yet another of said gates electrically coupled to said one gate and to said another gate, and including
   a fourth of said insulating layers formed on at least portions of said second silicon layer and said second insulating layer, and
   a third silicon layer formed on said fourth insulating layer.

10. The semiconductor memory device of claim 6, wherein yet another of said plurality of gates includes said sharp tip or thin wedge.

11. The semiconductor memory device of claim 10, wherein said another gate having said sharp tip or thin wedge is an erase gate.

12. A semiconductor memory device fabricated on a semiconductor substrate, comprising:
    a plurality of insulating regions formed spaced apart on said substrate with at least one active region defined therebetween;
    a first insulation layer formed on said active region;
    a patterned first silicon layer formed on a portion of the first insulating layer, wherein said first insulating layer is adapted to define a recess under said first silicon layer by substantially removing portions of said first insulating layer between the first silicon layer and the substrate, said recess providing exposed portions of said substrate and said first silicon layer;
    a patterned second insulating layer formed on at least a portion of the first silicon layer;
    a patterned third insulating layer formed on said exposed portions and partially filling said recess;
    a patterned second silicon layer formed on at least a portion of said third insulating layer and further filling said recess, said second silicon layer being adapted to include at least one of a sharp tip and a thin wedge extending under said first silicon layer;
    a fourth insulating layer formed on at least portions of said second silicon layer and said second insulating layer; and
    a third silicon layer formed on said fourth insulating layer.

13. The semiconductor memory device of claim 12, wherein
    said first silicon layer and said second insulating layer are patterned to form a first gate;

said third insulating layer and said second silicon layer are patterned to form a second gate capable of generating a high electrical field for the erasure of electrical charges in said gates; and, said fourth insulating layer and said third silicon layer are patterned to form a third gate.

14. The semiconductor memory device of claim 13, wherein said first gate is a select gate, said second gate is a floating gate and said third gate is a control gate, all of said gates being electrically coupled to each other.

15. The semiconductor memory device of claim 14, wherein said first gate is a control gate, said second gate is a floating gate and said third gate is an erase gate, all of said gates being electrically coupled to each other.

16. The semiconductor memory device of claim 12, wherein said fourth insulating layer is approximately 10 to 100 nm thick and comprises silicon dioxide or nitride.

* * * * *

UNITED STATES PATENT AND TRADEMARK OFFICE
CERTIFICATE OF CORRECTION

PATENT NO.     : 6,331,721 B1
DATED          : December 18, 2001
INVENTOR(S)    : Kuo-Tung Sung, Wen-Ting Chu and Huoy-Jong Wu It is certified that error appears in the above-identified patent and that said Letters Patent is hereby corrected as shown below:

<u>Title page,</u>
Please insert -- [73] Assignee: Mosel Vitelic, Inc. Republic of China --

Signed and Sealed this

Third Day of September, 2002

Attest:

Attesting Officer

JAMES E. ROGAN
Director of the United States Patent and Trademark Office